(12) United States Patent
Mira et al.

(10) Patent No.: US 11,395,439 B1
(45) Date of Patent: Jul. 19, 2022

(54) HEATSINK WITH VAPOR CHAMBER AND PEDESTAL

(71) Applicant: HEATSCAPE.COM, INC., Morgan Hill, CA (US)

(72) Inventors: Ali Mira, Morgan Hill, CA (US); Yashar Mira, Morgan Hill, CA (US); Michael Mira, Morgan Hill, CA (US)

(73) Assignee: Heatscape.com, Inc., Morgan Hill, CA (US)

( * ) Notice: Subject to any disclaimer, the term of this patent is extended or adjusted under 35 U.S.C. 154(b) by 0 days.

(21) Appl. No.: 17/202,209

(22) Filed: Mar. 15, 2021

(51) Int. Cl.
*H05K 7/20* (2006.01)
*H05K 1/02* (2006.01)

(52) U.S. Cl.
CPC ......... *H05K 7/2039* (2013.01); *H05K 1/0203* (2013.01); *H05K 2201/066* (2013.01)

(58) Field of Classification Search
CPC ............. H05K 7/20336; H05K 7/2039; H05K 7/20409; H05K 7/20418; H05K 1/181; H05K 1/0203; H05K 2201/064; H05K 7/20154; H05K 7/20163; H05K 2201/066
See application file for complete search history.

(56) References Cited

U.S. PATENT DOCUMENTS

| | | | | |
|---|---|---|---|---|
| 11,202,390 B2* | 12/2021 | Zhang | ................ | F28D 15/0275 |
| 2005/0051307 A1* | 3/2005 | Dussinger | ............. | H01L 23/427 |
| | | | | 257/E23.088 |
| 2006/0096740 A1* | 5/2006 | Zheng | ................ | F28D 15/0233 |
| | | | | 165/104.33 |
| 2007/0272399 A1* | 11/2007 | Nitta | ................... | F28D 15/0233 |
| | | | | 165/185 |
| 2012/0211201 A1* | 8/2012 | Kunstwadl | ............. | F21V 29/74 |
| | | | | 165/104.21 |
| 2017/0227298 A1* | 8/2017 | Sun | ..................... | F28D 15/0266 |
| 2017/0356694 A1* | 12/2017 | Tan | ..................... | F28D 15/0266 |
| 2017/0374762 A1* | 12/2017 | Cheng | ..................... | F28F 1/006 |
| 2019/0027425 A1* | 1/2019 | Mira | .................. | F28D 15/0233 |
| 2019/0128617 A1* | 5/2019 | Mira | .................. | F28D 15/0275 |

* cited by examiner

*Primary Examiner* — Adam B Dravininkas
(74) *Attorney, Agent, or Firm* — Kilpatrick Townsend & Stockton LLP

(57) ABSTRACT

The present technology relates to heat dissipation systems which may include vapor chambers. Vapor chambers may include top body portions and bottom body portions. A bottom body portion may include a first bottom side and a first perimeter wall extending from a perimeter of the first bottom side. The top body portion may be coupled to the first perimeter wall, and the bottom body portion may define an opening extending between a first inner surface and a first outer surface of the bottom side. Vapor chambers may also include an insert body formed separately from the bottom body portion. The insert body extends through the opening and is coupled to the bottom body portion. A sealed interior volume of the vapor chamber may comprise a first portion defined by the top body portion and the first bottom side; and a second portion defined by the opening and the insert body.

20 Claims, 10 Drawing Sheets

HEATSINK WITH VAPOR CHAMBER AND PEDESTAL

FIELD OF THE INVENTION

The present technology relates to heat dissipation systems, i.e. cooling systems, including vapor chambers used for cooling electrical components.

BACKGROUND

Chips (e.g., microchips or integrated circuits) generate heat when used. Central processing units (CPUs) and graphics processing units (GPUs) are two non-limiting examples of chips that can generate a tremendous amount of heat as a result of performing numerous extremely high-speed operations required for executing computer programs. In order to operate properly, the heat is dissipated in order to cool the chip, for example with a heatsink. The computer industry is continually innovating cooling systems to address the unique and demanding cooling requirements of chips that produce large amounts of heat.

A heatsink is used to transfer heat away from the chip and towards the cooling fins of the heatsink. The cooling fins provide a large surface area for the transfer of the heat from the cooling fins to the surrounding environment through convection, conduction, and radiation. Some heatsinks include vapor chambers to transfer heat from the chip toward the cooling fins.

Heatsinks may be mounted directly on top of a chip on a printed circuit board, and the chip may be surrounded by a stiffener coupled to the printed circuit board, wherein the stiffener may be positioned proud relative to the chip, i.e. extends further from the printed circuit board than the chip. The proximity of the stiffener to the chip is beneficial to reducing the amount of board real estate which the stiffener occupies. However, the proximity and proudness of the stiffener relative to the chip may not allow full contact of a heatsink with the top of the chip and therefore reduce thermal transfer performance. Accordingly, there is a need for a heatsink to fully contact a chip closely surrounded by a proud stiffener.

BRIEF SUMMARY

The present technology relates to heat dissipation systems which may include vapor chambers. Vapor chambers may include top body portions and bottom body portions. A bottom body portion may include a first bottom side and a first perimeter wall extending from a perimeter of the first bottom side. The top body portion may be coupled to the first perimeter wall, and the bottom body portion may define an opening extending between a first inner surface and a first outer surface of the bottom side. Vapor chambers may also include an insert body formed separately from the bottom body portion. The insert body extends through the opening and is coupled to the bottom body portion. A sealed interior volume of the vapor chamber may comprise a first portion defined by the top body portion and the first bottom side; and a second portion defined by the opening and the insert body.

BRIEF DESCRIPTION OF THE DRAWINGS

The features of the various embodiments described above, as well as other features and advantages of certain embodiments of the present technology will be more apparent from the following detailed description taken in conjunction with the accompanying drawings, in which.

In accordance with common practice, the described features and elements are not drawn to scale but are drawn to emphasize features and elements relevant to the present disclosure.

DETAILED DESCRIPTION

Aspects of the present technology relate generally to systems and methods of assembly relating to a vapor chamber including a two part bottom side including a bottom body portion and a separately formed insert body coupled to and extending from the bottom body portion, and used to contact and transfer heat from a chip on a printed circuit board.

In the following description, various examples of vapor chamber assemblies and methods for assembling the vapor chamber are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

In the following description, directional phrases may be used to describe positions and orientations of components of the embodiments of the present technology. The directional phrases may be used for purposes of explanation to describe relative positions of two or more different components, and are not limiting in the positions and orientations that embodiments of the present technology may be placed. For example, a surface may be referred to as a top surface of a component of a device with reference to the figures, wherein the top surface faces upwards in the figures. However, the device may be oriented in a different orientation than shown in the figures so that the top surface may face any other direction, for example sideways or down.

Figure 1A:
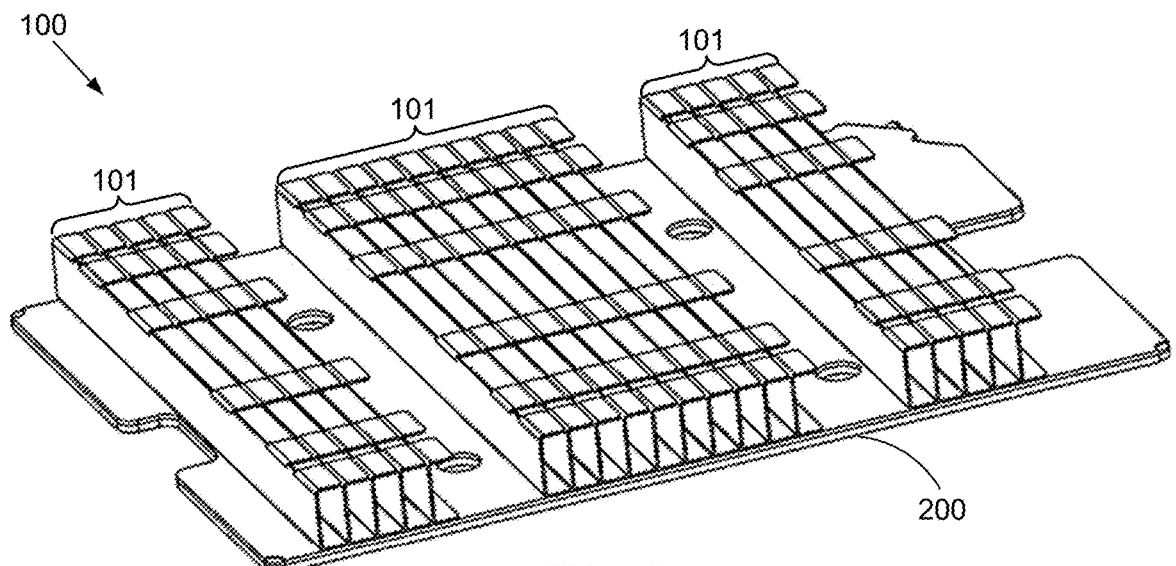
FIGS. 1A-C show views of a heatsink assembly according to embodiments of the present technology.
Figure 1B:
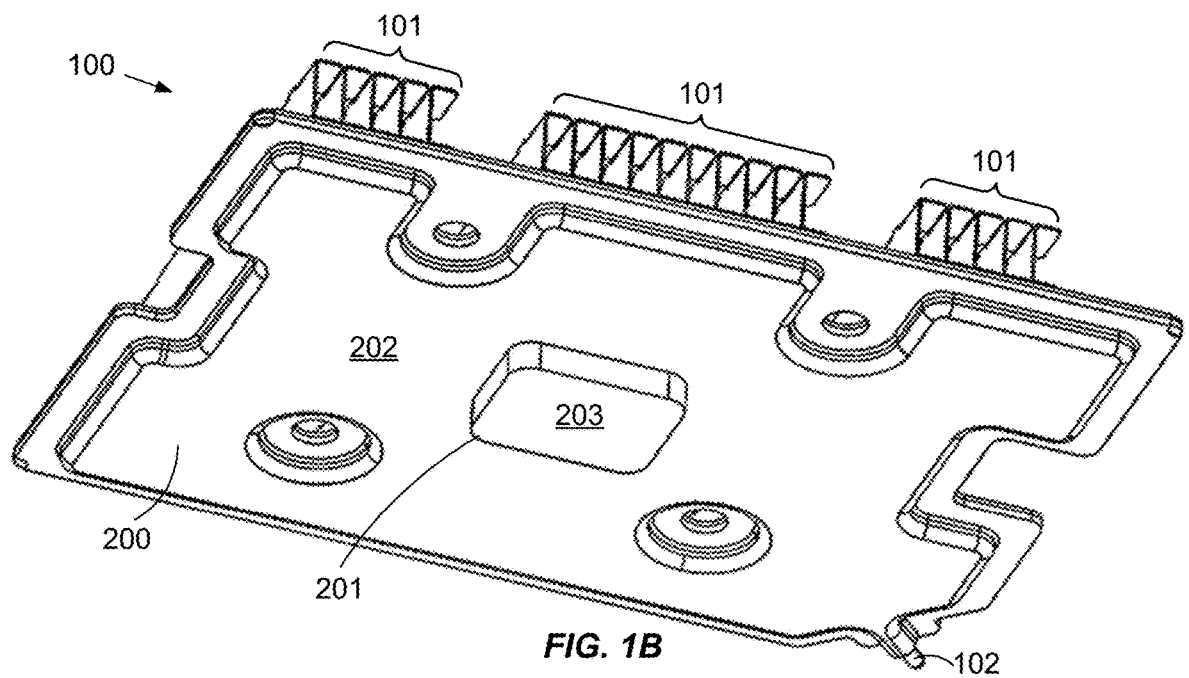

FIG. 1A shows a top perspective view of a system in the form of a heatsink assembly 100. The heatsink assembly 100 may include a vapor chamber 200 and a plurality of cooling fins 101, coupled to the vapor chamber. As shown in the side view of FIG. 1C, the vapor chamber 200 of the heatsink assembly 100, includes a projection 201 extending beyond a first outer surface 202 defining a second outer surface 203. The second outer surface 203 may be generally planar and during use of the vapor chamber 200 contacts a chip on a printed circuit board and facilitates the transfer of heat from the chip into the interior volume of the vapor chamber, which in turn is transferred to and dissipates into the environment with the cooling fins 101. The distance between the first outer surface and the second outer surface may be at least 2 mm. and in embodiments may be between 2 mm and 5 mm.

Figure 2A:
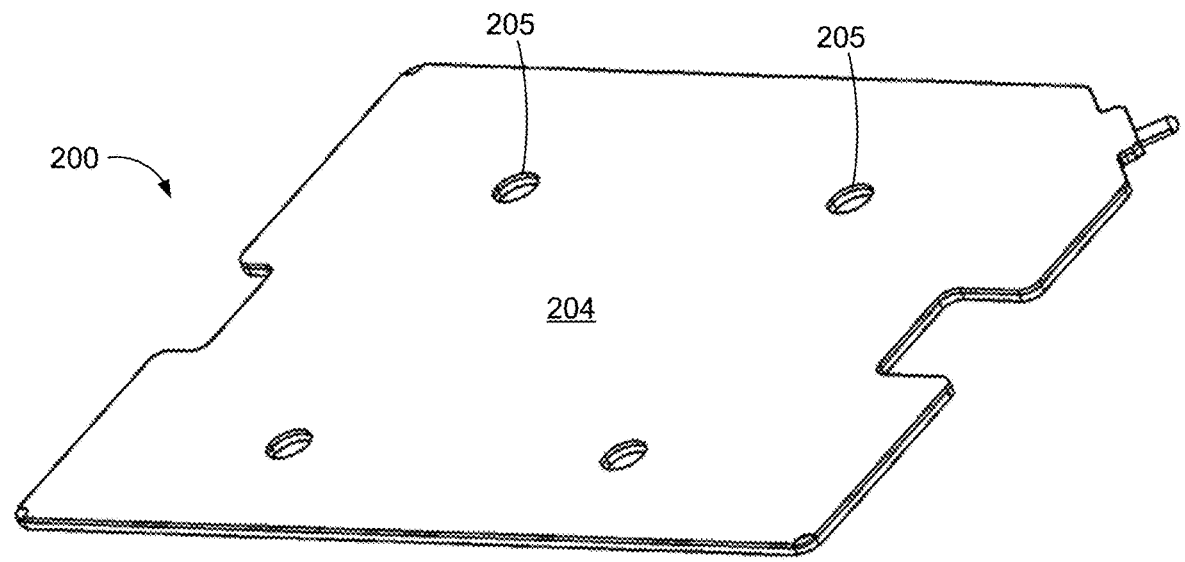
FIGS. 2A-2E show views of a vapor chamber according to embodiments of the present technology.
Figure 2B:
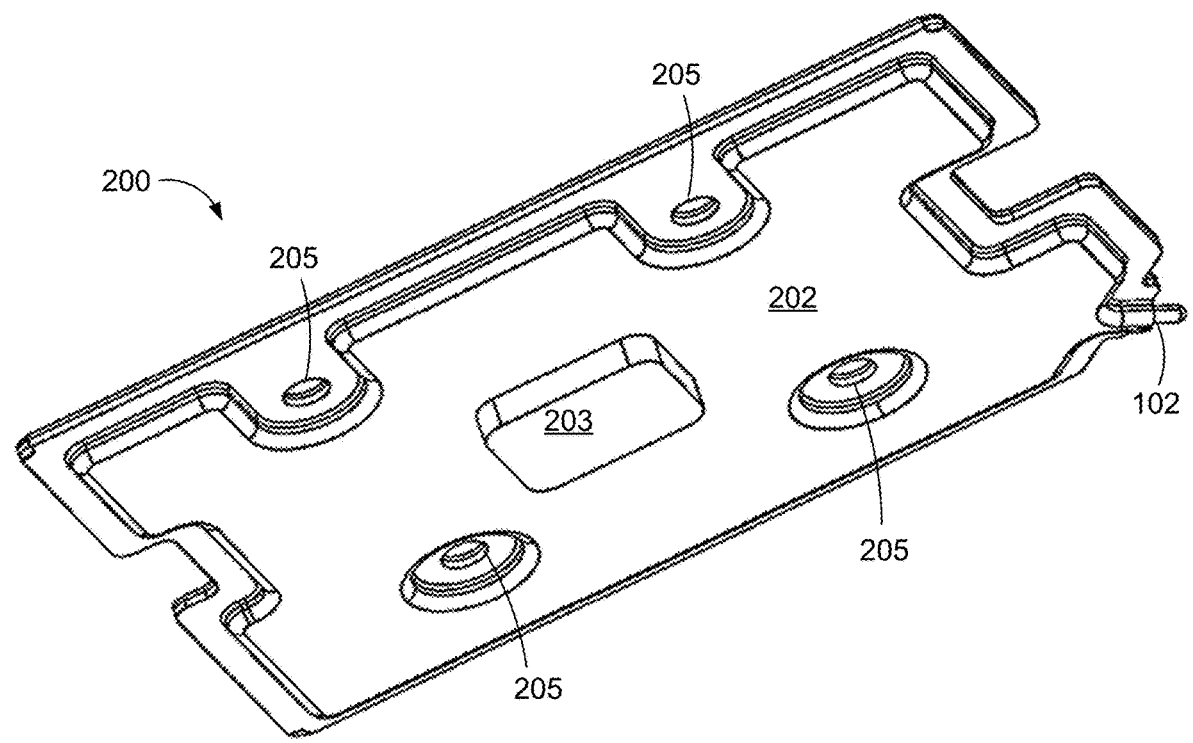

FIG. 2A shows a top perspective view of the vapor chamber 200. As shown, the vapor chamber 200 may define a top surface 204. In embodiments, the top surface 204 may be substantially planar. FIG. 2B shows a bottom perspective view of the vapor chamber 200, as shown, the bottom side of the vapor chamber 200 comprises the first outer surface 202 and the second outer surface 203. As shown in FIGS. 2A and 2B, the vapor chamber 200 may define mounting holes 205 for receiving fasteners for coupling the vapor chamber 200 to a printed circuit board. The mounting holes 205 may be positioned around the second outer surface 203 so that the vapor chamber 200 may be coupled to the printed circuit board in locations surrounding the chip which the vapor chamber 200 is absorbing heat from through the second outer surface 203.

Figure 2C:
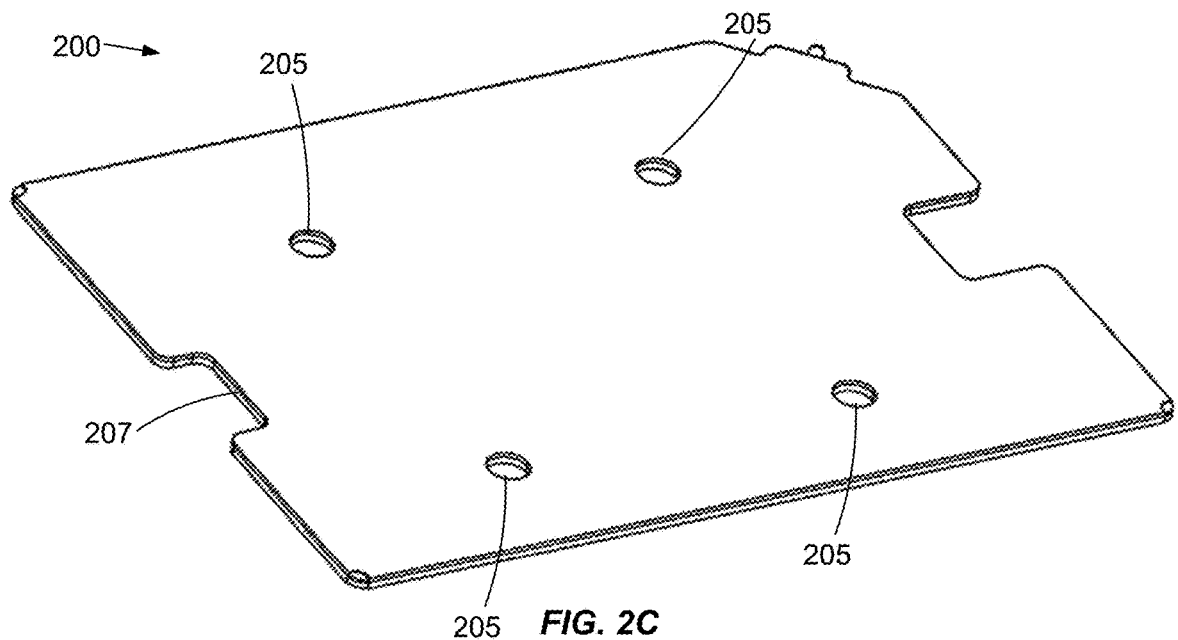
Figure 2D:
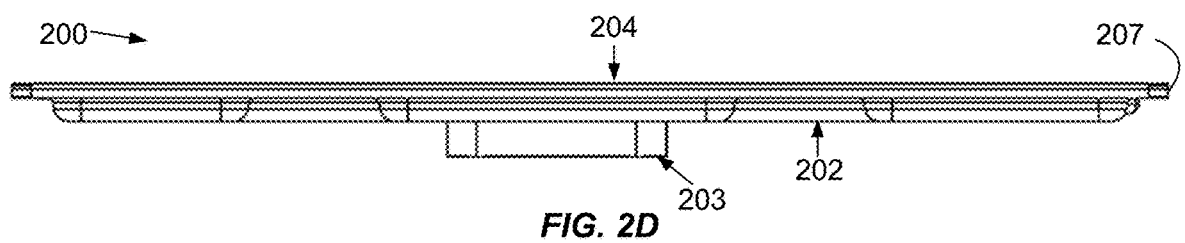
Figure 2E:
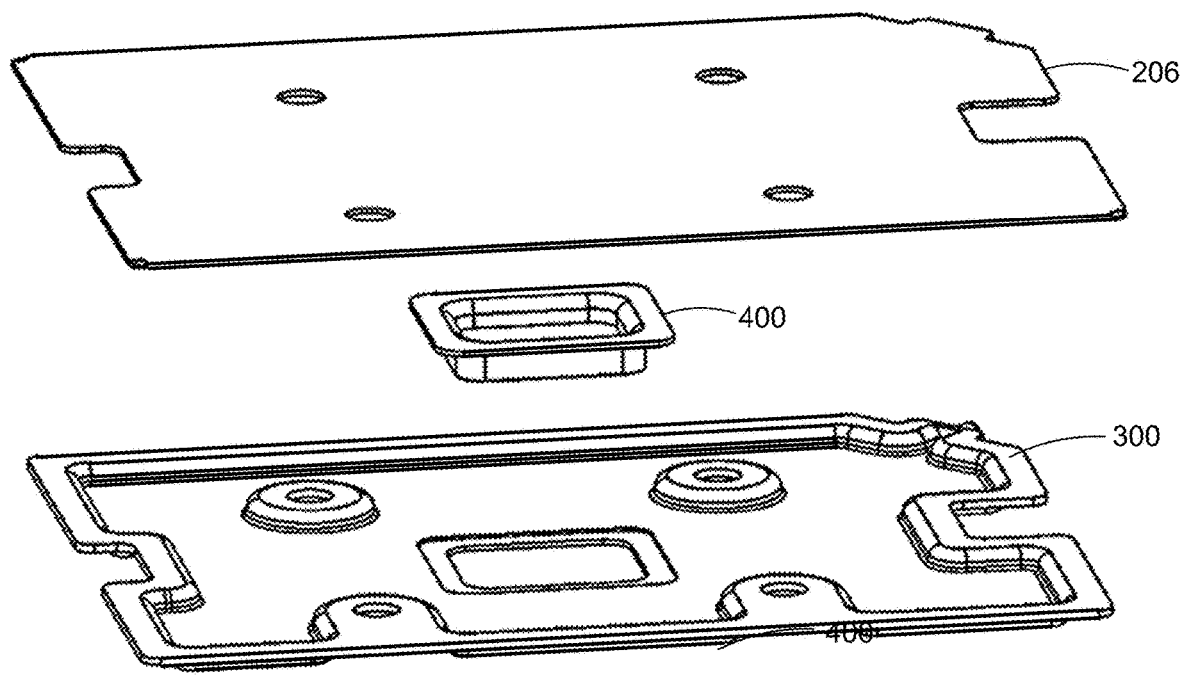

The vapor chamber 200 may be formed of a plurality of components. FIG. 2E shows an exploded view of a vapor chamber 200 illustrating the different separate components of the vapor chamber 200. As shown, the vapor chamber may include a top body portion 206, a bottom body portion 300, and an insert body 400.

Figure 1C:
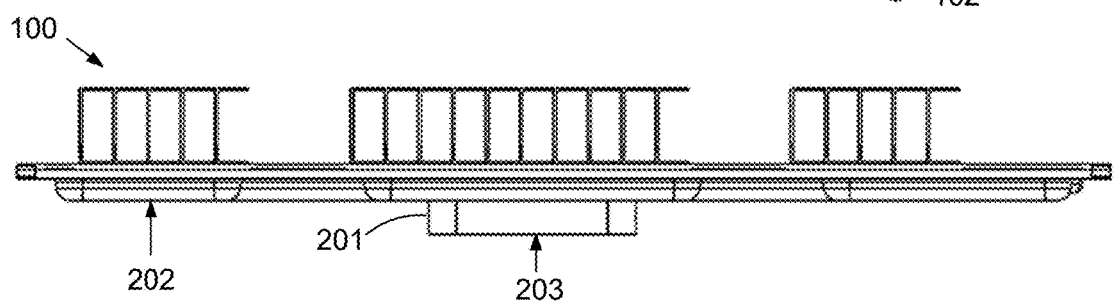

The top body portion 206 may be substantially planar, and may be formed of a sheet of metal, for example copper. As shown, the top body portion 206 may not include any raised and/or embossed surface features. The top body portion 206 may define portions of the mounting holes 205 corresponding and aligning to other portions of the mounting holes 205 defined by the bottom body portion. As shown in FIGS. 1A and 1C, the cooling fins 101 may be coupled to the top surface 204 of the top body portion 206, for example with one or more of brazing, welding, fasteners and adhesives. As shown in FIG. 1A, the cooling fins 101 may be positioned so that the mounting holes 205 are accessible from above the heatsink assembly 100.

Figure 3A:
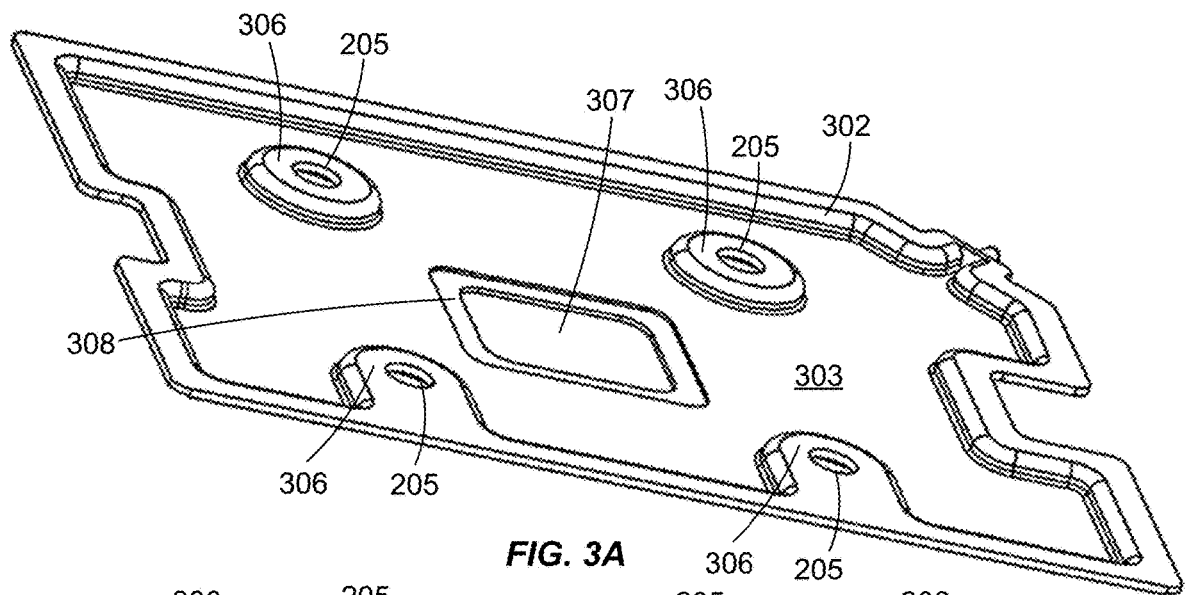
FIGS. 3A-3C show views of a bottom portion of a vapor chamber according to embodiments of the present technology.
Figure 3B:
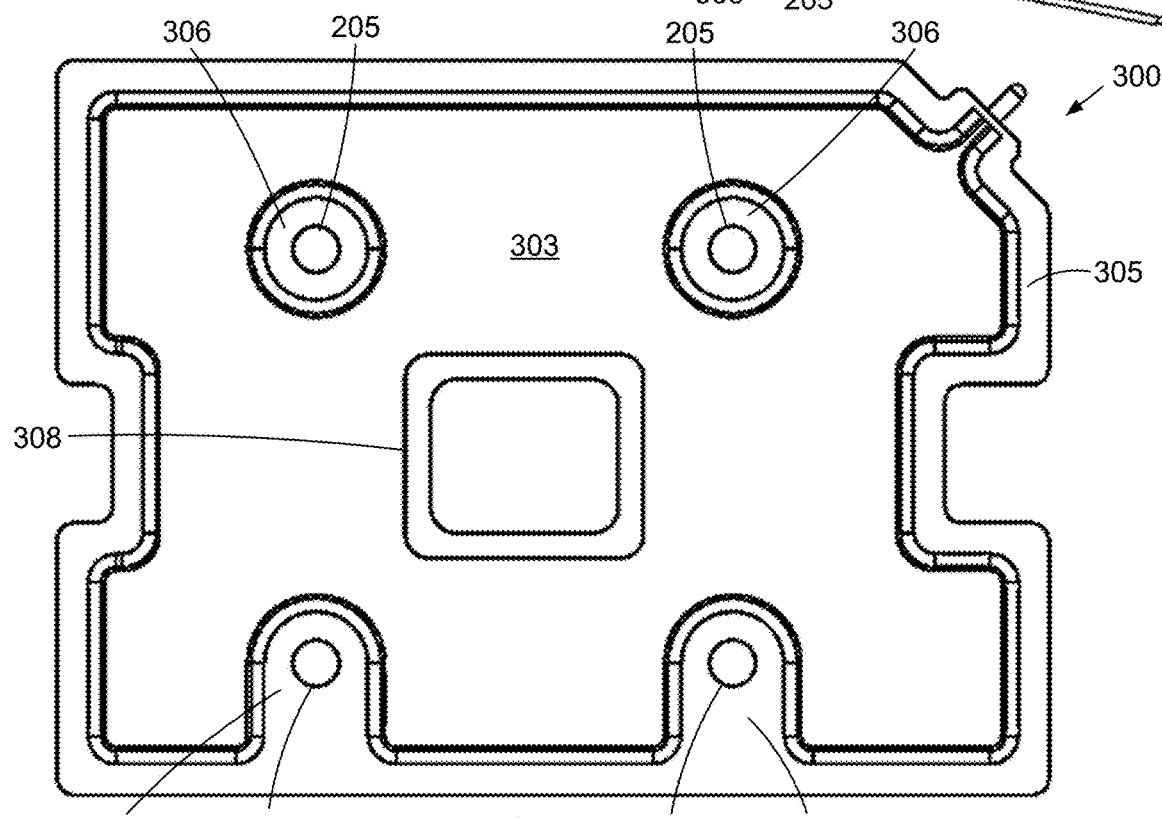
Figure 3C:
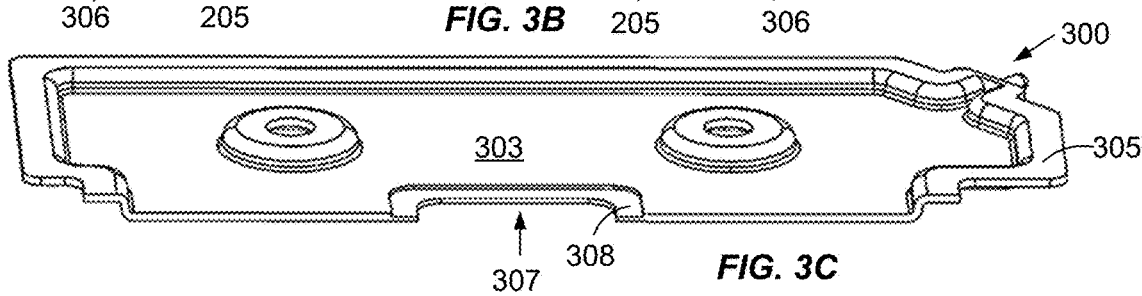

FIGS. 3A-3C show views of a bottom body portion 300. As shown, the bottom body portion 300 may comprise a bottom side 301, which may be referred to as a first bottom side, and a perimeter wall 302, which may be referred to as a first perimeter wall. The bottom side 301 may be substantially planar and define an inner surface 303, which may be referred to as a first inner surface, and an outer surface 304, which may be referred to as a first outer surface. The inner surface 303 and outer surface 304 may be substantially planar and parallel to each other.

The perimeter wall 302 extends from a perimeter of the bottom side 301 so that the inner surface 303 and the perimeter wall 302 define an open recess. In embodiments, the perimeter wall 302 defines a flange portion 305. The flange portion 305 may define a perimeter of the bottom body portion 300. The flange portion 305 may define a planar top surface of the bottom body portion 300, and the planar top portion of the flange portion 305 may be parallel to the inner surface 303. As shown in FIG. 2E, the perimeter of the bottom body portion 300, defined by the flange portion 305, may correspond in size and shape with the top body portion 206, so that the top body portion 206 and bottom body portion 300 may be coupled together to form a flush perimeter edge 207, as shown for example in FIGS. 2A, 2C and 2D. The top body portion 206 and bottom body portion 300 may be coupled together with one or more of brazing, welding, fasteners and adhesives.

In embodiments, the bottom body portion 300 may include internal support pillars. For example as shown in FIG. 3A, internal support pillars 306 may be defined by the bottom side 301 and extend from the inner surface 303. In embodiments, the internal support pillars 306 may be fully or partially surrounded by the inner surface 303, and may extend from the perimeter wall 302 and include a contiguous surface with the top surface of the flange portion. The internal support pillars 306 may be offset from the inner surface 303 the same amount as the top surface of the flange portion 305 so that the planar top body portion may contact and be supported by a combination of the flange portion 305 and the internal support pillars 306.

The bottom body portion 300 defines an opening 307 extending between the inner surface 303 and the outer surface 202. As will be discussed in great detail below, the opening may be shaped and sized to correspond to the insert body 400. For example, as shown, the opening 307 may be substantially rectangular and include rounded corners. The opening 307 may be positioned centrally relative to the perimeter wall 302 and may be position in between the plurality of internal support pillars 306.

The bottom side 301 of the bottom body portion 300 may further define a recessed surface 308 around the opening 307. The recessed surface 308 may be recessed relative to the inner surface 303 and outer surface 202. As shown, the recessed surface faces in the same direction as the inner surface 303, and in an assembled state of the vapor chamber 200 the recessed surface 308 faces the top body portion 206. As will be discussed in greater detail below, the recessed surface 308 is shaped and sized to correspond to a portion of the insert body 400. For example, the recessed surface 308 may be substantially rectangular corners and define a uniform width border around the opening 307.

In embodiments, the bottom body portion 300, including the features discussed above, is formed from sheet metal, for example copper. In embodiments, the bottom body portion 300 may be formed by stamping a sheet of metal using one or more dies to define the perimeter wall 302, flange portion 305, internal support pillars 306, opening 307 and/or mounting holes 205. In embodiments, the recessed surface 308 may be formed by stamping and/or machining the inner surface 303.

FIGS. 4A-4D show views of an insert body 400. In embodiments, the insert 400 is formed separately from the bottom body portion 300 to which it is coupled. The insert body 400 comprises a bottom side 401, which may be referred to as a second bottom side, and a perimeter wall 402, which may be referred to as a second perimeter wall. The perimeter wall 402 extends from a perimeter of the bottom side 401 in order to define an open recess.

The bottom side 401 defines an inner surface 403, which may be referred to as a second inner surface, and an outer surface 404, which may be referred to as a second outer surface, opposite the inner surface 403. The inner surface 404 may be substantially planar. The inner surface 404 is sized and shaped to correspond to a top surface of a chip to which the vapor chamber 200 of the heatsink assembly 100 is coupled against in order to transfer heat from the chip to the vapor chamber.

The insert body 401 may include a flange 405 extending from the perimeter wall 402 opposite the bottom side 401. The flange 405 defines a top surface 406 at a top side of the insert body 400. As shown, the flange 405 extends radially away from the perimeter wall 402. The flange may define a thickness corresponding to a distance between the inner surface 303 of the bottom body portion 300 and the recessed surface 308 of the bottom body portion 300, so that in an assembled state, for example as shown in FIGS. 5B and 5C, the top surface 406 of the flange 405 is flush with the inner surface 303.

The perimeter wall 402 defines an interior side surface 407 including a lower portion 408 extending around and substantially perpendicularly from the inner surface 403 of the bottom side 401 and an upper portion 409 extending from the lower portion 408 to the top surface 406 of the flange 405. The upper portion 409 defines a curved flush transition between the lower portion 408 and the top surface 406 of the flange 405, as shown for example in the cross-sectional view of FIG. 4D.

Figure 4A:
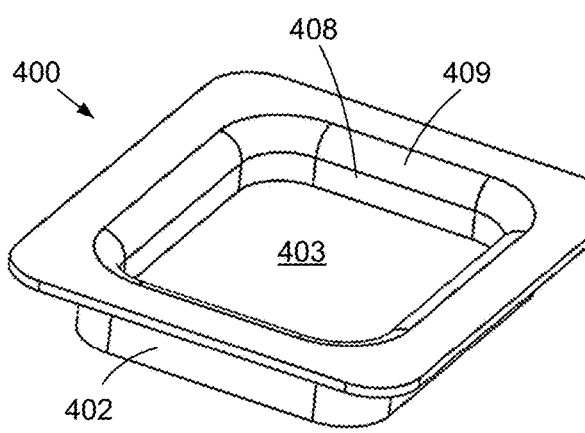
FIGS. 4A-4D show views of an insert portion of a vapor chamber according to embodiments of the present technology.
Figure 4B:
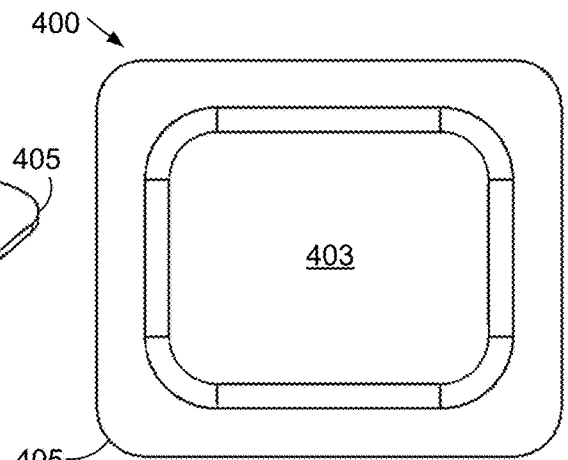
Figure 4C:
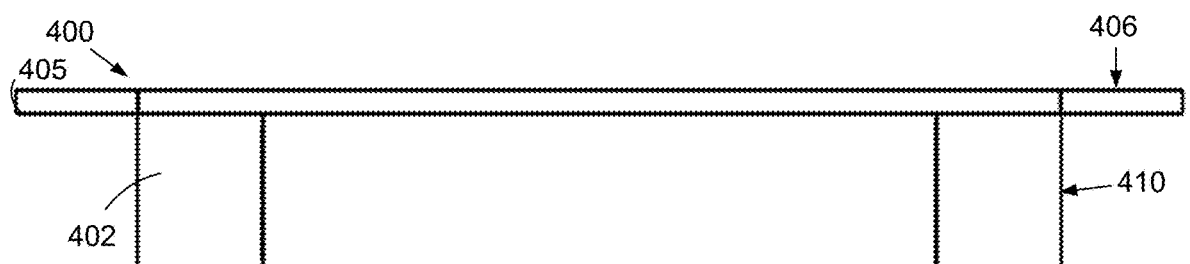
Figure 4D:
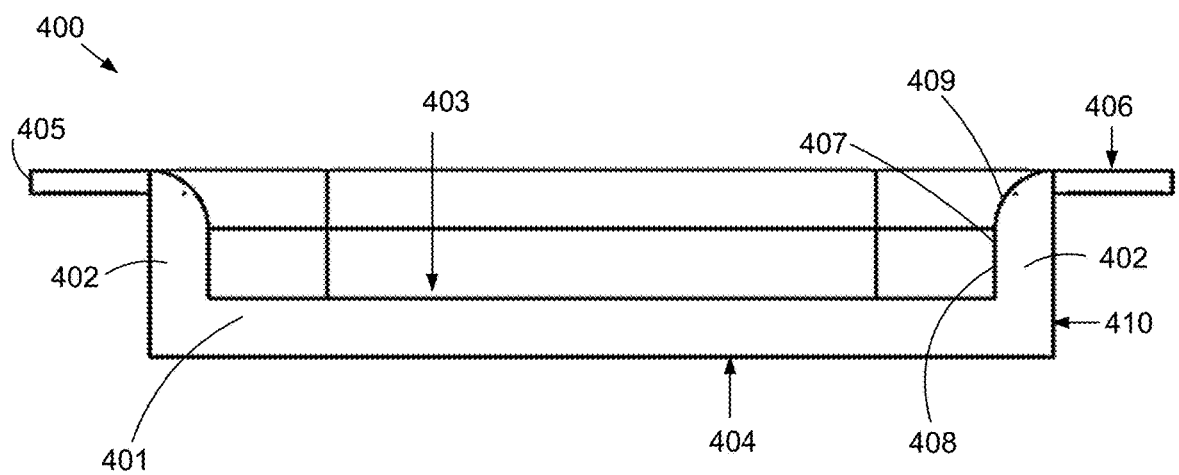

In embodiments, the insert body 400, including the features discussed above, is formed from a block of metal, for example copper. In embodiments, the insert body 400 may be formed by machining a block of metal to define the bottom side 401, perimeter wall 402, inner side 403, outer side 404, and flange 405. Machining a block of metal is beneficial compared to stamping sheet metal due to more complex geometries and steeper draft angles that are not possible with stamping. For example, in embodiments, the perimeter wall 402 extends perpendicularly, i.e. 90 degrees, relative to the outer surface 404, for example as shown in FIG. 4D. In the assembled view, the perimeter wall 402 defines the sidewall of the projection 201 and a perpendicular perimeter wall results in the sidewall of the projection 201 extending perpendicularly from the outer surface 202. As shown in FIG. 4C, an outer side surface 410 forms a perpendicular angle with the planar outer surface 404. In embodiments, the angle between the outer side surface 410 and outer surface 404 may be substantially perpendicular, for example +/−3 degrees or +/−5 degrees. Forming a substantially perpendicular angle with substantially uniformly thick perimeter walls and bottom sides as shown in FIG. 4D, is not possible with manufacturing techniques such as stamping sheet metal.

Figure 5A:
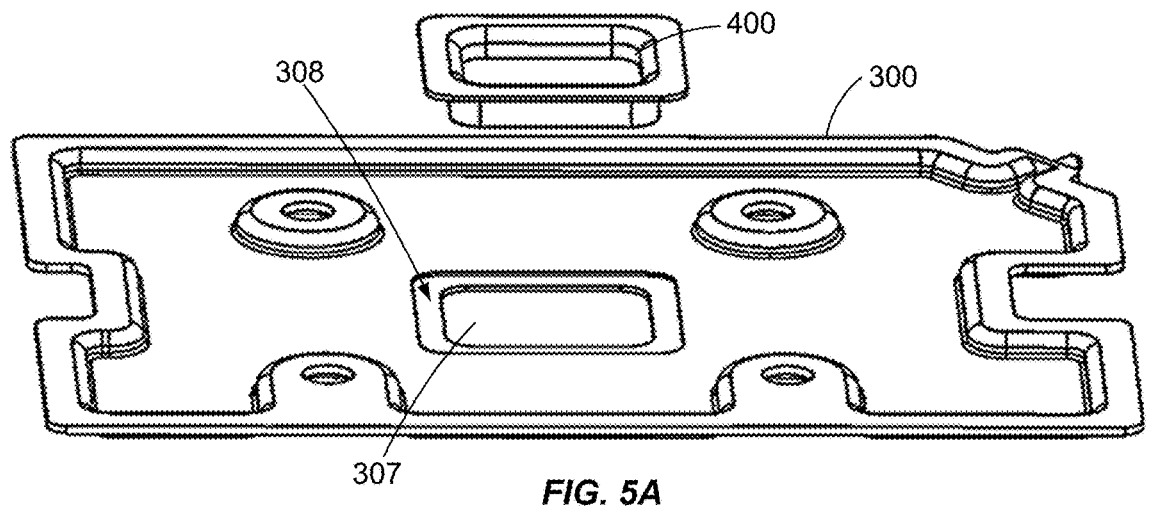
FIGS. 5A-5C show views of an assembly of a bottom portion and an insert portion of a vapor chamber according to embodiments of the present technology.
Figure 5B:
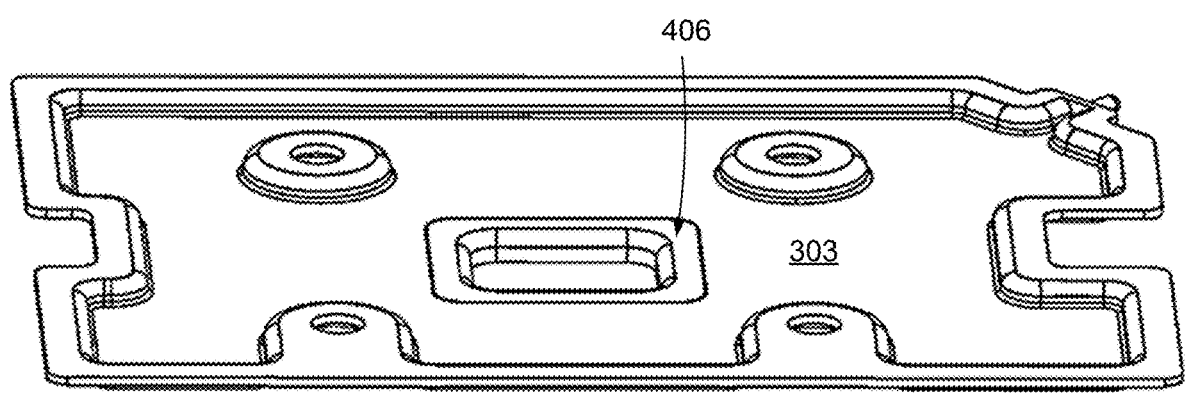
Figure 5C:
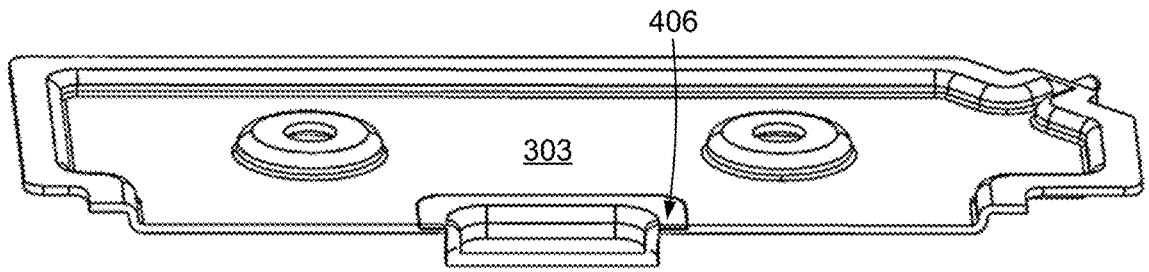

FIGS. 5A-5C show views of coupling an insert body 400 to a bottom body portion 300. As shown in FIG. 5A, the insert body 400 is positioned over the opening 307 so that the insert body may be inserted through the opening 307 from the inner surface 303 side of the bottom body portion 300. Once positioned within the opening, for example as shown in FIG. 5B, the insert body 400 may be coupled to the bottom body portion 300, for example with one or more of brazing, welding, fasteners and adhesives. As shown in FIGS. 5B and 5C, the top surface 406 of the flange 405 may be flush with the inner surface 303 due to the depth of the recessed surface 308 and the thickness of the flange 405.

In embodiments, the top body portion 206 may be coupled to the bottom body portion 300 after the insert body 400 is inserted within the opening 307. The top body portion 206 may be coupled to the bottom body portion 300 with one or more of brazing, welding, fasteners and adhesives. As shown in FIGS. 2A-2D, the top body portion 206 is coupled to the bottom body portion 300 so that the mounting holes 205 defined in each component are aligned, and the perimeters of each component define the flush perimeter edge 207.

Coupling the top body portion 206 to the bottom body portion 300 and the bottom body portion 300 to the insert body 400 forms a sealed interior volume defining the vapor chamber 200. The open recess, defined by the bottom body portion 300, covered by the top body portion 206 defines a first portion of the interior volume of the vapor chamber. Specifically, the first portion of the interior volume is define by a bottom surface of the top body portion 206, the perimeter wall 302, and the inner surface 303. The open recess, defined by the insert body 400 defines a second portion of the interior volume. The first and second portions of the interior volume are in fluid communication via the opening 307 at the top side of the insert body 400.

The sealed interior volume may be filled with a fluid via a fill port. For example, a fill port 102 may be defined in the perimeter wall 302 of the bottom body portion. With the vapor chamber 200 coupled to a printed circuit board with the inner surface 203 against a chip generating heat, the fluid within the vapor chamber adjacent to the heated surface is vaporized. Specifically, the fluid within the second portion of the sealed interior volume within the insert body 400 is vaporized fluid and migrates toward cooler surfaces of the vapor chamber, including the bottom surface of the top body portion 206, and condenses. The condensed fluid may then flow via gravity downwardly. In use, a vapor chamber may be oriented so that the heated surface of the vapor chamber is at a low point relative to gravity. As discussed above, the inner surface 303 is flush with the top surface 406 of the flange 406, and further the top surface 406 of the flange 405 is flushed with a curved transition 409. This flush arrangement and curved transitions assist in the flow of condensed fluid from the first portion of the sealed interior volume back to the second portion in order to be re-vaporized. The vaporization and condensation cycle facilitate heat transfer from the outer surface 203 to the cooling fins 101.

Figure 6A:
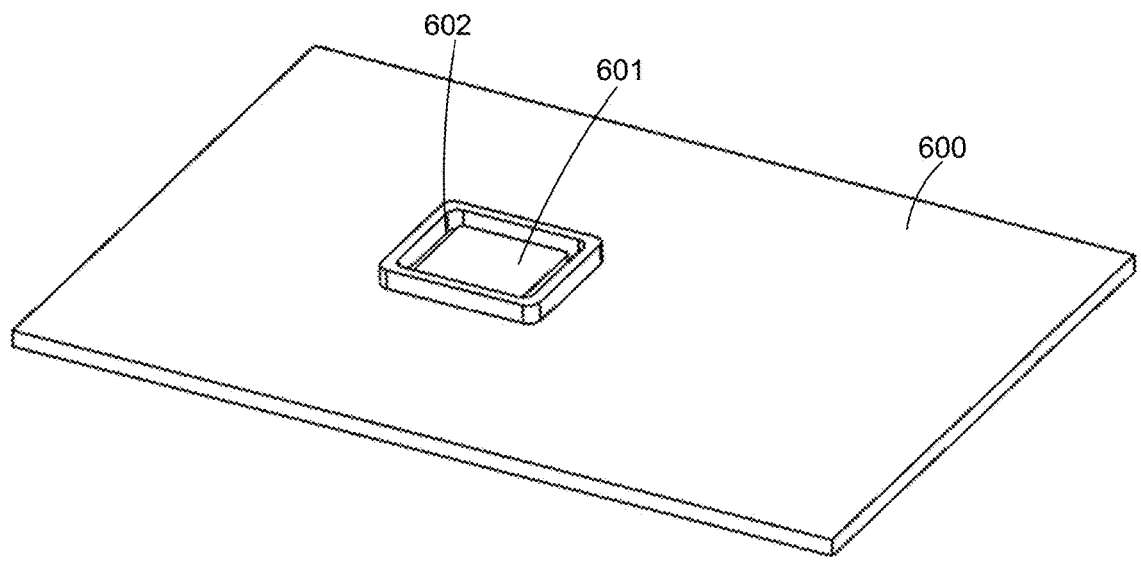
FIGS. 6A-6H show steps of coupling a heatsink assembly onto a chip on a board according to embodiments of the present technology.
Figure 6B:
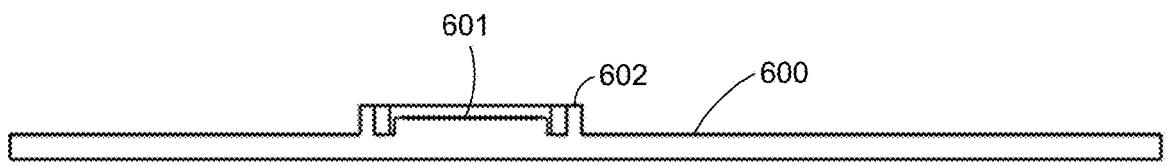
Figure 6C:
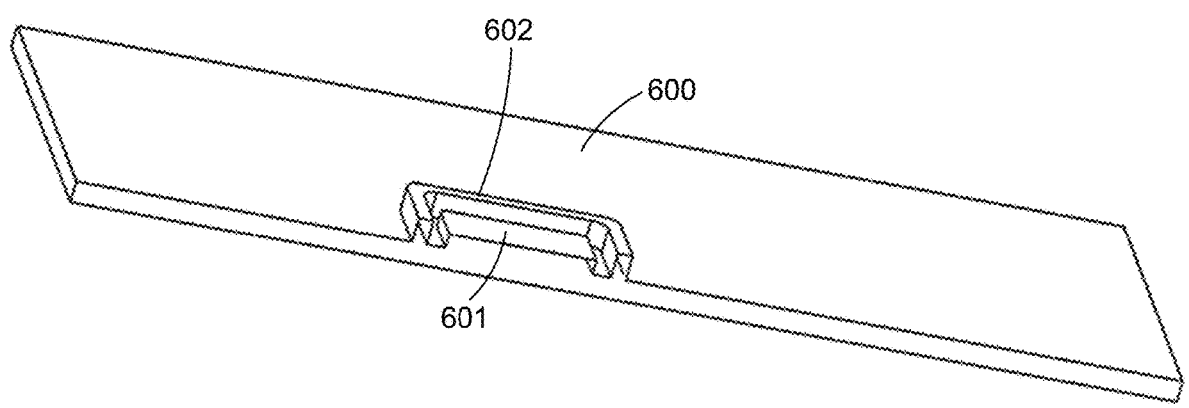

FIGS. 6A-6F show steps of coupling a heatsink assembly 100 onto a chip 601 on a printed circuit board 600. As shown in FIG. 6A, the chip 601 is surrounded by a stiffener 602 also coupled to the printed circuit board 600. The stiffener 602 may include a rectangular metal frame surrounding the chip 601. As shown in the cross-sectional views of FIGS. 6B and 6C, the stiffener may be proud of the chip 601 so that a top surface of the stiffener 602 is further from the printed circuit board 600 than a top surface of the chip 601. In embodiments, the stiffener may be between 0.5 mm and 2 mm proud of the chip. In embodiments, an inner sidewall of the stiffener, facing the chip may be positioned between 0.5 mm and 1 mm from the sides of the chip.

Figure 6D:
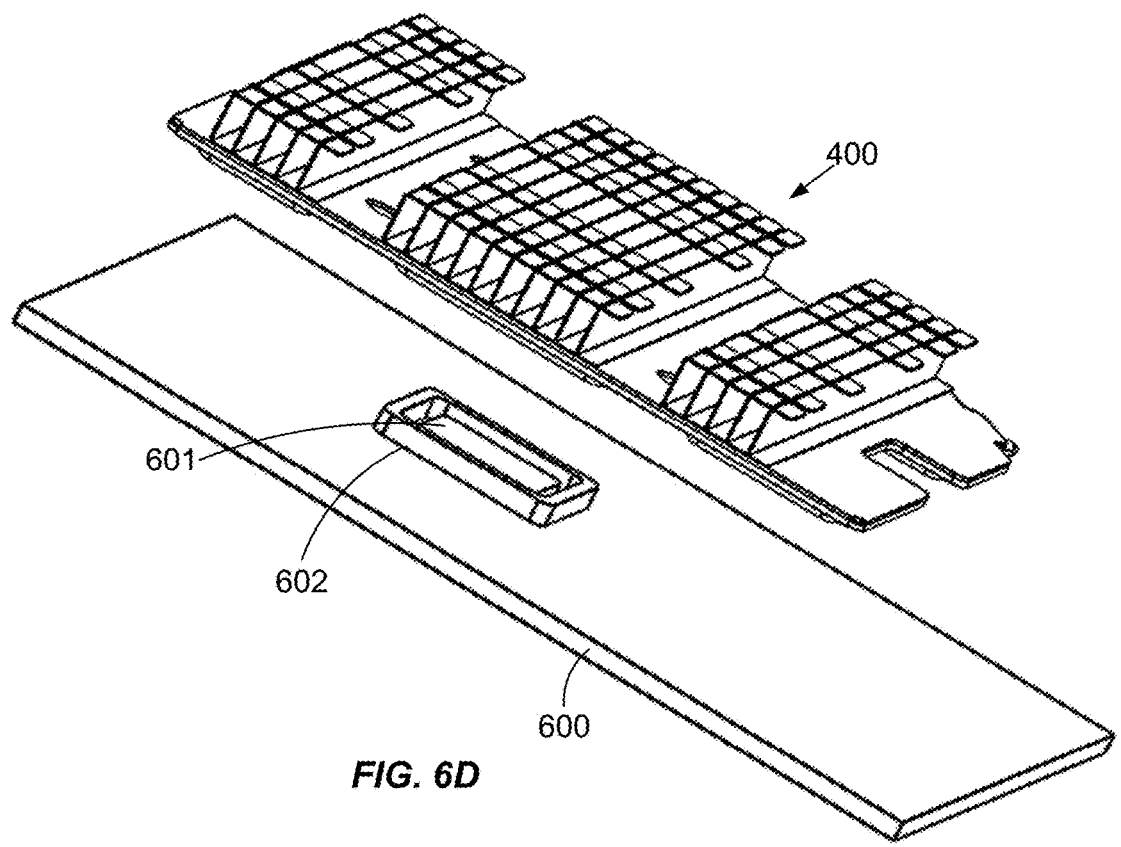
Figure 6E:
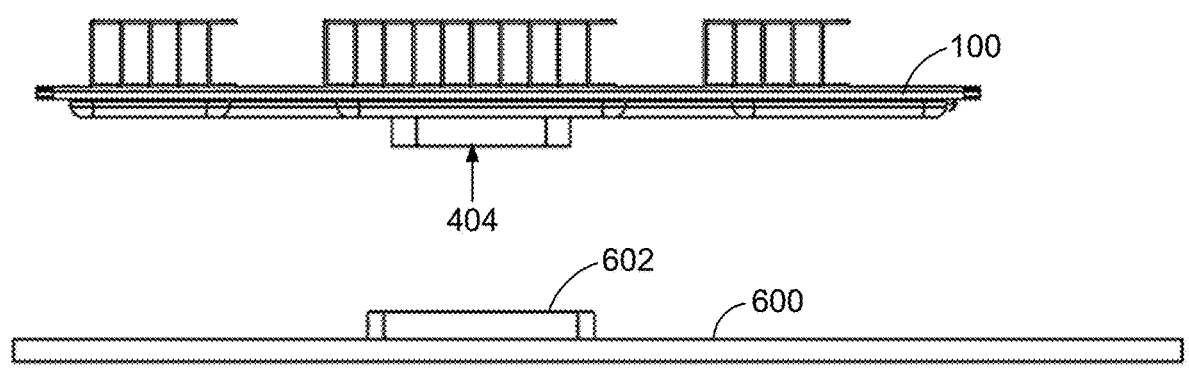
Figure 6F:
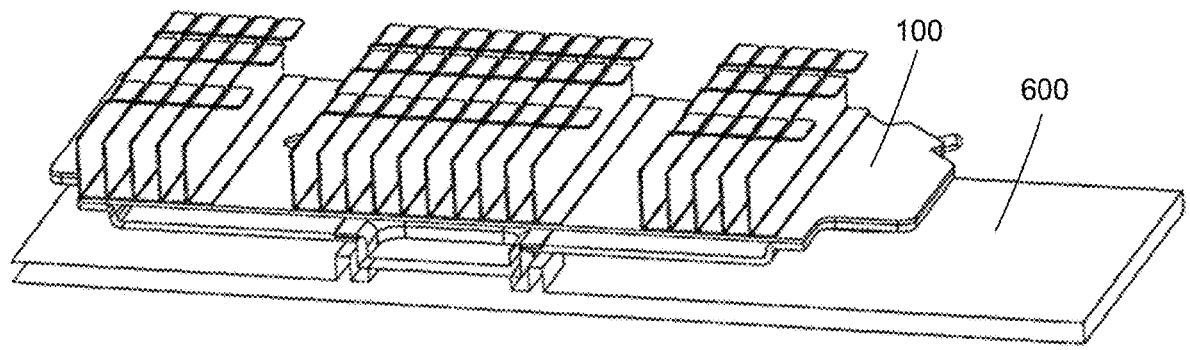
Figure 6G:
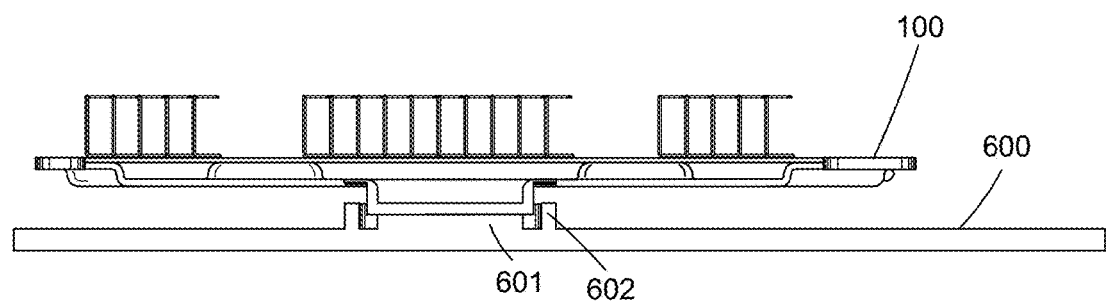
Figure 6H:
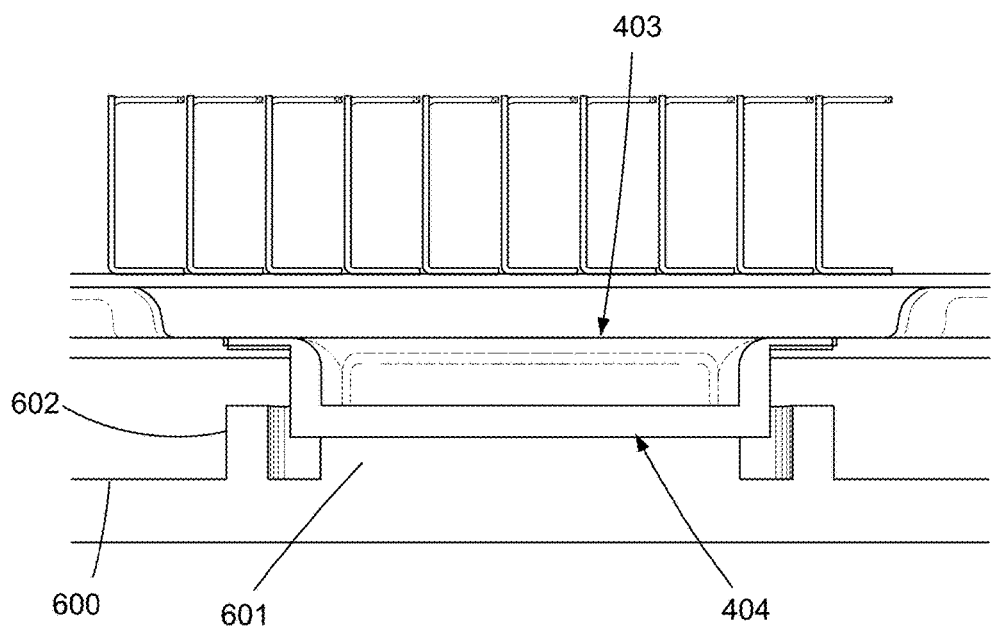
Figure 7A:
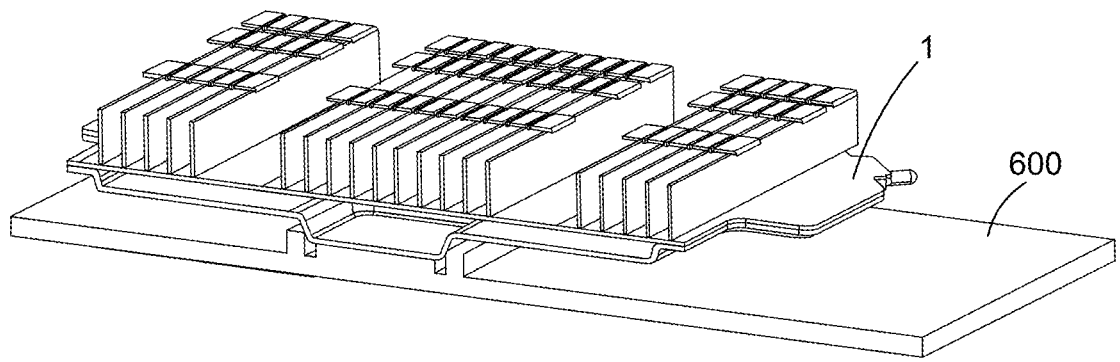
FIGS. 7A and 7B show a heatsink assembly including a stamped bottom portion coupled to a board over a chip according to embodiments of the present technology.
Figure 7B:
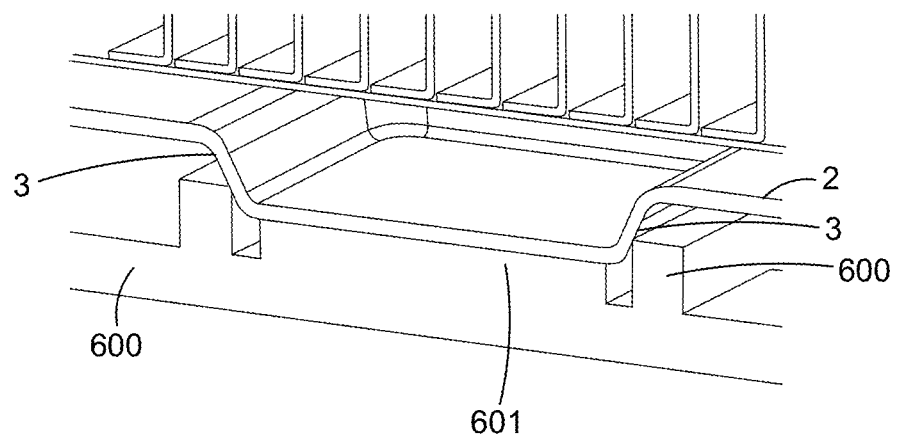

As shown in FIGS. 6D and 6E, the heatsink assembly 100 may be positioned over the chip 601 and stiffener 602 with the outer surface 404 aligned over the top surface of the chip 601. The heatsink assembly 100 may then be coupled to the board, as shown in FIGS. 6F-6H so that the outer surface 404 contacts the chip 601. As shown in detail in FIG. 6H, with outer surface 404 contacting the chip 601, the insert body 400 does not contact the stiffener due to the substantially perpendicular perimeter wall 402, and the outer surface 404 fully contacts and covers the chip 601. This lack of contact is not possible with a heatsink assembly 1 which includes a vapor chamber with a stamped bottom portion 2 as is shown in FIGS. 7A and 7B. As shown in FIG. 7B, the bottom portion 2 include an angled sidewall 3 due to the stamping manufacturing process. This angle sidewall 3 contacts the stiffener 602 and therefore inhibits full contact and compression of the heatsink assembly 1 against the chip 601.

The terms "approximately", "about", and "substantially" as used herein represent an amount close to the stated amount that still performs a desired function or achieves a desired result. For example, the terms "approximately", "about", and "substantially" may refer to an amount that is within less than 10% of, within less than 5% of, within less than 1% of, within less than 0.1% of, and within less than 0.01% of the stated amount.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above.

Similarly, this method of disclosure is not to be interpreted as reflecting an intention that any claim require more features than are expressly recited in that claim. Rather, inventive aspects may lie in a combination of fewer than all features of any single foregoing disclosed embodiment. Thus, the claims following the Detailed Description are hereby expressly incorporated into this Detailed Description, with each claim standing on its own as a separate embodiment.

The invention claimed is:

1. A heat dissipation system, comprising:
a vapor chamber comprising:
  a top body portion;
  a bottom body portion comprising a first bottom side and a first perimeter wall extending from a perimeter of the first bottom side, wherein the top body portion is coupled to the first perimeter wall, and wherein the bottom body portion defines an opening extending between a first inner surface and a first outer surface of the bottom side; and
  an insert body formed separately from the bottom body portion, wherein the insert body extends through the opening and is coupled to the bottom body portion around the opening, wherein the insert body comprises a second bottom side and a second perimeter wall extending from a perimeter of the second bottom side, and wherein a portion of the second perimeter wall extends between the first outer surface of the bottom body portion and the second bottom side,
wherein the top body portion, the bottom body portion and the insert body are coupled together to form a sealed interior volume, and
wherein the sealed interior volume comprises a first portion defined by the top body portion, the first perimeter wall, the first bottom side, and the opening, and a second portion defined by the opening, the second perimeter wall, and the second bottom side.

2. The system of claim 1, wherein the second bottom side of the insert body defines a second inner surface defining a side of the second portion of the sealed interior volume, and a second outer surface, opposite the second inner surface, and external to the sealed interior volume, and
  wherein the second outer surface is configured to contact a chip in order to transfer heat from the chip into the interior volume.

3. The system of claim 2, wherein the second perimeter wall extends substantially perpendicularly to the first outer surface and the second outer surface.

4. The system of claim 3, wherein a distance between the first outer surface and the second outer surface is at least 2 mm.

5. The system of claim 2, wherein the insert body further comprises a flange extending from the second perimeter wall so that the perimeter wall extends between the flange and the second outer surface, and
  wherein the flange is coupled to the bottom body portion around the opening.

6. The system of claim 5, wherein the bottom body portion defines a recessed surface around the opening and between the first inner surface and the first outer surface,
  wherein the recessed surface faces the top body portion, and
  wherein the flange contacts the recessed surface.

7. The system of claim 6, wherein the flange defines a thickness corresponding to a distance between the first inner surface and the recessed surface so that a top surface of the flange is flush with the first inner surface.

8. The system of claim 7, wherein the second perimeter wall defines an interior side surface including a lower portion extending substantially perpendicularly from the second inner surface of the second bottom side and an upper portion extending from the lower portion to the top surface of the flange, and
  wherein the upper portion defines a curved flush transition between the lower portion and the top surface of the flange.

9. The system of claim 8, wherein the insert body is formed by milling a metal block.

10. The system of claim 9, wherein the metal block comprises copper.

11. The system of claim 9, wherein the bottom body portion is formed by stamping a sheet of metal.

12. The system of claim 11, wherein the sheet of metal and the metal block each comprise copper.

13. The system of claim 11, wherein the insert body is coupled to the bottom body portion with brazing.

14. The system of claim 2, further comprising a plurality of fins coupled to the top body portion and configured to dissipate heat from the interior volume.

15. The system of claim 14, further comprising a fluid within the interior volume.

16. The system of claim 15, further comprising:
a printed circuit board;
a chip coupled to a surface of the printed circuit board; and
a stiffener coupled to the surface of the printed circuit board and surrounding the chip,
  wherein the stiffener extends further from the surface of the printed circuit board than the chip,
  wherein the second outer surface contacts the chip, and
  wherein the vapor chamber does not contact the stiffener.

17. The system of claim 1, wherein the top body portion is coupled to the bottom body portion with brazing.

18. A method of manufacturing the system of claim 1, comprising:
  milling a metal block to form the insert body;
  stamping a sheet of metal to form the bottom body portion;
  brazing the insert body to the bottom body portion to define a bottom assembly; and
  brazing the top body portion to the bottom assembly to define the interior volume of the vapor chamber.

19. The method of claim 18, wherein the metal block comprises copper.

20. The method of claim 18, wherein the sheet of metal and the metal block each comprise copper.

\* \* \* \* \*